(12) United States Patent
Wakamatsu

(10) Patent No.: US 12,374,564 B2
(45) Date of Patent: Jul. 29, 2025

(54) PROCESSING APPARATUS

(71) Applicant: Tokyo Electron Limited, Tokyo (JP)

(72) Inventor: Takayoshi Wakamatsu, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 413 days.

(21) Appl. No.: 17/904,296

(22) PCT Filed: Feb. 5, 2021

(86) PCT No.: PCT/JP2021/004340
§ 371 (c)(1),
(2) Date: Aug. 16, 2022

(87) PCT Pub. No.: WO2021/166687
PCT Pub. Date: Aug. 26, 2021

(65) Prior Publication Data
US 2023/0066576 A1  Mar. 2, 2023

(30) Foreign Application Priority Data

Feb. 17, 2020 (JP) .................................. 2020-023923
Nov. 26, 2020 (JP) .................................. 2020-196352

(51) Int. Cl.
*H01L 21/67* (2006.01)
*B23Q 11/00* (2006.01)
(Continued)

(52) U.S. Cl.
CPC .... *H01L 21/67023* (2013.01); *B23Q 11/0042* (2013.01); *B23Q 11/08* (2013.01);
(Continued)

(58) Field of Classification Search
CPC ......... H01L 21/67023; H01L 21/67092; H01L 21/67253; H01L 21/687; H01L 21/6719;
(Continued)

(56) References Cited

U.S. PATENT DOCUMENTS 4,996,762 A * 3/1991 Takayama .............. B23Q 39/02
219/69.11
5,313,743 A * 5/1994 Peschik .................. B24B 55/02
451/449
(Continued)

FOREIGN PATENT DOCUMENTS

CN  106736825 A  *  5/2017  ............. B05B 12/04
CN  108581845 B  *  3/2024  ............. B03C 1/30
(Continued)

OTHER PUBLICATIONS

Machine translation of JP-10180585-A (Year: 1998).*
International Search Report of PCT/JP2021/004340 dated Apr. 20, 2021.

*Primary Examiner* — David G Cormier
*Assistant Examiner* — Thomas Bucci
(74) *Attorney, Agent, or Firm* — Shih IP Law Group, PLLC.

(57) ABSTRACT

A processing apparatus includes a chuck configured to hold a substrate; a moving unit to which a processing tool configured to process the substrate is mounted; a sprinkler configured to spray a cleaning liquid configured to clean the moving unit from an outside of the moving unit; and a housing accommodating the chuck, the processing tool, and the sprinkler therein. The sprinkler includes a fixed unit fixed to an inside of the housing, and a rotating unit rotatably supported at the fixed unit. The rotating unit includes a nozzle configured to discharge the cleaning liquid, and a rotation block configured to hold the nozzle.

20 Claims, 14 Drawing Sheets

(51) Int. Cl.
  *B23Q 11/08* (2006.01)
  *B24B 7/22* (2006.01)
  *B24B 55/06* (2006.01)
  *H01L 21/687* (2006.01)
(52) U.S. Cl.
  CPC .............. *B24B 7/228* (2013.01); *B24B 55/06* (2013.01); *H01L 21/67092* (2013.01); *H01L 21/67253* (2013.01); *H01L 21/687* (2013.01)
(58) Field of Classification Search
  CPC ............. H01L 21/304; H01L 21/67051; H01L 21/67219; B23Q 11/0042; B23Q 11/08; B24B 7/228; B24B 55/06; B24B 7/00
  USPC ........................................................ 134/198
  See application file for complete search history.

(56) References Cited

U.S. PATENT DOCUMENTS

| | | | | |
|---|---|---|---|---|
| 6,066,562 A * | 5/2000 | Ohshima | ........... | H01L 21/02013 125/11.01 |
| 6,095,899 A * | 8/2000 | Elmar | ....... | B24D 7/10 451/28 |
| 6,224,462 B1 * | 5/2001 | Yokoyama | ................ | B24B 5/00 451/10 |
| 6,240,942 B1 * | 6/2001 | Ball | ................. | H01L 21/67017 451/53 |
| 6,319,093 B1 * | 11/2001 | Lebel | ............... | H01L 21/67253 451/6 |
| 6,319,105 B1 * | 11/2001 | Togawa | ........... | H01L 21/67051 451/449 |
| 6,431,964 B1 * | 8/2002 | Ishikawa | ................ | B24B 7/228 451/287 |
| 10,603,752 B2 * | 3/2020 | Morimura | .......... | B23Q 17/2409 |
| 10,889,012 B2 * | 1/2021 | Morimura | ............. | B23Q 11/00 |
| 11,059,145 B2 * | 7/2021 | Okamoto | ............. | B24B 53/017 |
| 11,407,036 B2 * | 8/2022 | Kuriya | ....................... | B23B 3/22 |
| 2002/0168921 A1 * | 11/2002 | Adachi | .................. | B28D 5/024 451/8 |
| 2008/0202568 A1 * | 8/2008 | Benner | ................... | B24B 57/02 134/198 |
| 2012/0006363 A1 * | 1/2012 | Milojevic | ............... | B08B 3/024 134/144 |
| 2014/0099870 A1 * | 4/2014 | Lee | ...................... | B24B 53/007 451/450 |
| 2015/0158137 A1 * | 6/2015 | Mori | ...................... | B24B 57/02 451/73 |
| 2016/0339553 A1 * | 11/2016 | Nakazawa | ........... | B25J 11/0085 |
| 2017/0043442 A1 * | 2/2017 | Takikawa | ................ | B05B 15/60 |
| 2017/0144262 A1 | 5/2017 | Okuda | | |
| 2017/0329316 A1 * | 11/2017 | Morimura | ............... | B23B 3/065 |
| 2018/0126567 A1 * | 5/2018 | Morimura | ................ | B25J 19/02 |
| 2019/0076981 A1 * | 3/2019 | Sekiya | ................ | B24B 27/0683 |
| 2019/0118324 A1 * | 4/2019 | Fujii | .................. | B23Q 11/0075 |

FOREIGN PATENT DOCUMENTS

| | | | | |
|---|---|---|---|---|
| EP | 1063058 A2 * | 12/2000 | ............. | B24B 57/02 |
| JP | 10180585 A * | 7/1998 | | |
| JP | 2001009720 A * | 1/2001 | ............. | B24B 57/02 |
| JP | 2011049578 A * | 3/2011 | | |
| JP | 2015199146 A | 11/2015 | | |
| JP | 2017047510 A * | 3/2017 | | |
| JP | 2017059809 A | 3/2017 | | |
| JP | 2017094420 A * | 6/2017 | ............. | B05B 12/04 |
| JP | 2017127910 A * | 7/2017 | | |

\* cited by examiner

PROCESSING APPARATUS

CROSS-REFERENCE TO RELATED APPLICATIONS

This Application is a U.S. national phase application under 35 U.S.C. § 371 of PCT Application No. PCT/JP2021/004340 filed on Feb. 5, 2021, which claims the benefit of Japanese Patent Application Nos. 2020-023923 and 2020-196352 filed on Feb. 17, 2020, and Nov. 26, 2020, respectively, the entire disclosures of which are incorporated herein by reference.

TECHNICAL FIELD

The various aspects and embodiments described herein pertain generally to a processing apparatus.

BACKGROUND

A grinding apparatus described in Patent Document 1 brings a grinding surface of a grinding whetstone into contact with a surface of a processing target object held by a holding table to grind the processing target object. Further, this grinding apparatus cleans an inside of a grinding chamber by allowing a grinding liquid supplied to the grinding whetstone to be scattered to an outside of a grinding tool. The grinding tool includes a ring-shaped base and a plurality of grinding whetstones arranged in a ring shape on a bottom surface of the base. Some of the grinding liquid is drained in multiple directions through a plurality of through holes of the base by a centrifugal force of the grinding tool to be used as cleaning water for cleaning the grinding chamber.

PRIOR ART DOCUMENT

Patent Document 1: Japanese Patent Laid-open Publication No. 2015-199146

DISCLOSURE OF THE INVENTION

Means for Solving the Problems

In an exemplary embodiment, a processing apparatus includes a chuck configured to hold a substrate; a moving unit to which a processing tool configured to process the substrate is mounted; a sprinkler configured to spray a cleaning liquid configured to clean the moving unit from an outside of the moving unit; and a housing accommodating the chuck, the processing tool, and the sprinkler therein. The sprinkler includes a fixed unit fixed to an inside of the housing, and a rotating unit rotatably supported at the fixed unit. The rotating unit includes a nozzle configured to discharge the cleaning liquid, and a rotation block configured to hold the nozzle.

DETAILED DESCRIPTION

Figure 1:
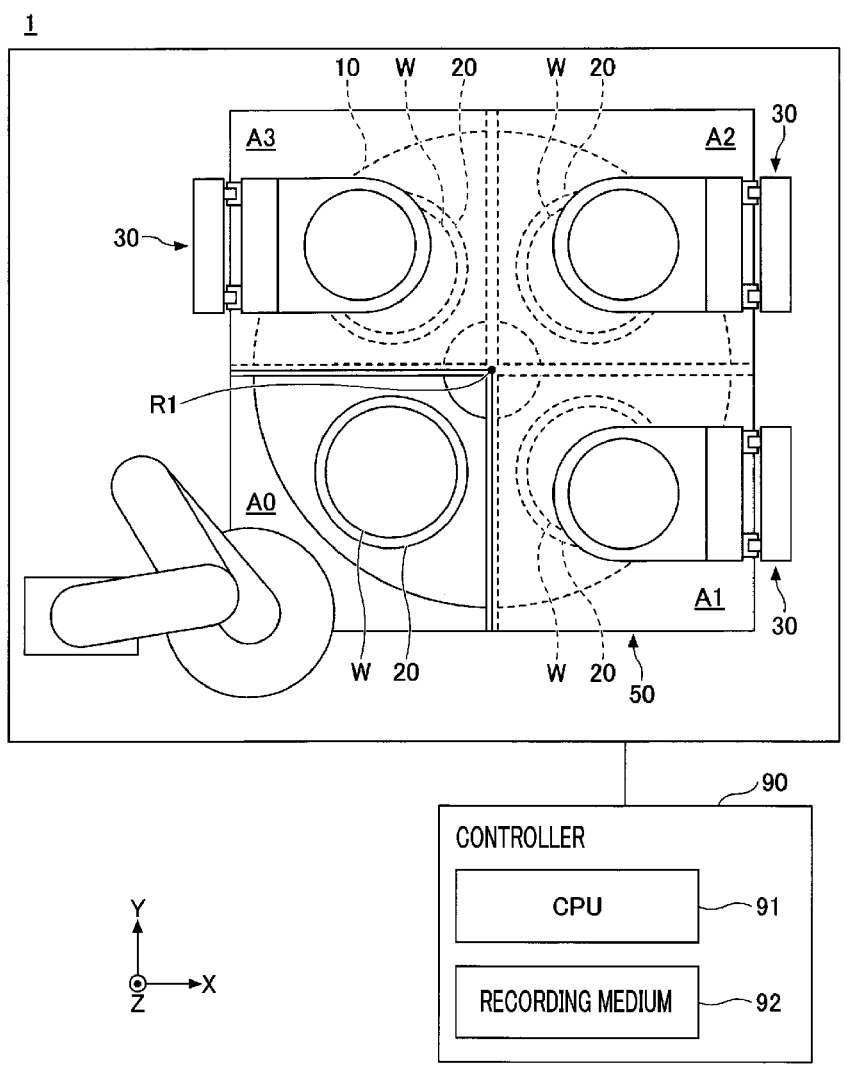
FIG. 1 is a plan view illustrating a grinding apparatus according to an exemplary embodiment.

Hereinafter, an exemplary embodiment of the present disclosure will be described with reference to the accompanying drawings. In the following exemplary embodiment, although the inventive concept of the present disclosure is applied to a grinding apparatus, it may be applied to a cutting apparatus instead of the grinding apparatus. The grinding apparatus, the cutting apparatus, and the like are referred to as a processing apparatus together. The processing apparatus is an apparatus configured to process a substrate. Further, grinding includes polishing. Moreover, in the various drawings, same or corresponding parts will be assigned same reference numerals, and redundant description thereof will be omitted. In the present specification, the X-axis direction, the Y-axis direction, and the Z-axis direction are directions orthogonal to each other. Further, the X-axis direction and the Y-axis direction are horizontal directions, whereas the Z-axis direction is a vertical direction.

First, referring to FIG. 1, a grinding apparatus 1 will be explained. The grinding apparatus 1 is configured to grind a substrate W. The substrate W includes a semiconductor substrate such as a silicon wafer or a compound semiconductor wafer, or a glass substrate. The substrate W may further include a device layer formed on a surface of the semiconductor substrate or the glass substrate. The device layer includes an electronic circuit. Further, the substrate W may be a combined substrate in which a plurality of substrates are bonded together. Grinding includes polishing. Abrasive grains for use in the grinding may be fixed abrasive grains or free abrasive grains. The grinding apparatus 1 includes, for example, a rotary table 10, four chucks 20, and three grinding units 30.

The rotary table 10 is configured to hold the four chucks 20 around a rotation center line R1 at an equal distance therebetween, and is rotated about the rotation center line R1. Each of the four chucks 20 is rotated together with the rotary table 10, and is moved to a carry-in/out position A0, a first grinding position A1, a second grinding position A2, a third grinding position, and back to the carry-in/out position A0 in this sequence.

The carry-in/out position A0 serves as both a carry-in position where carrying-in of the substrate W is performed and a carry-out position where carrying-out of the substrate W is performed. In the present exemplary embodiment, although the carry-in position and the carry-out position are the same position, the carry-in position and the carry-out position may be different positions. The first grinding position A1 is a position where first grinding is performed. The second grinding position A2 is a position where second grinding is performed. The third grinding position A3 is a position where third grinding is performed.

Figure 2:
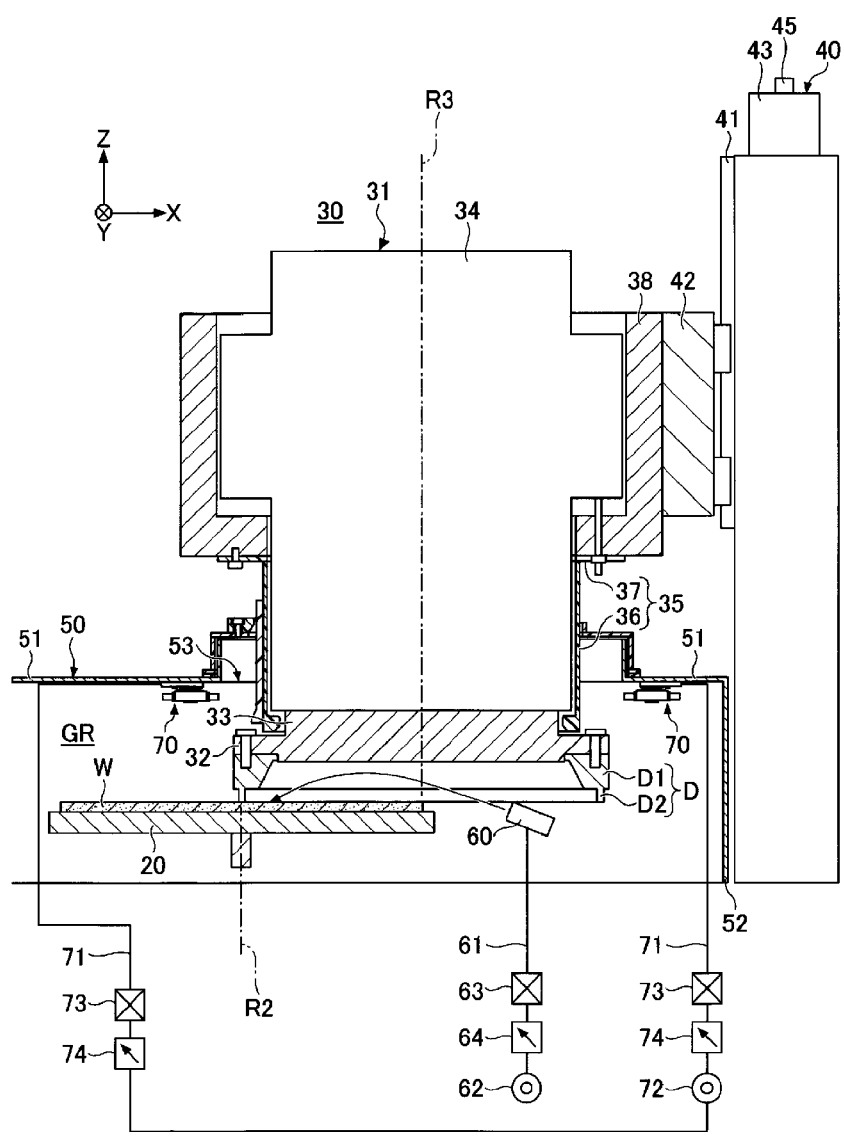
FIG. 2 is a cross sectional view of main components of the grinding apparatus of FIG. 1, showing a state when grinding is performed.

The four chucks 20 are mounted to the rotary table 10 so as to be rotatable about their own rotation center lines R2 (see FIG. 2). At the first grinding position A1, the second grinding position A2, and the third grinding position A3, the chucks 20 are rotated about their own rotation center lines R2.

One of the grinding units 30 performs the first grinding on the substrate W at the first grinding position A1. Another grinding unit 30 performs the second grinding on the substrate W at the second grinding position A2. The other grinding unit 30 performs the third grinding on the substrate W at the third grinding position A3.

Here, the number of the grinding units 30 may be one or more. Further, the number of the chucks 20 just needs to be larger than the number of the grinding units 30. The rotary table 10 does not need to be provided. When there is no rotary table 10, the number of the chucks 20 may be equal to the number of the grinding units 30, or only one chuck 20 may be provided.

Now, with reference to FIG. 2 and FIG. 3, the grinding unit 30 will be discussed. The grinding unit 30 includes a moving unit 31 to which a grinding tool D is mounted. The grinding tool D is brought into contact with substrate W to grind it. The grinding tool D includes, by way of example, a disk-shaped grinding wheel D1, and a plurality of grinding whetstones D2 arranged in a ring shape on a bottom surface of the grinding wheel D1.

In the present exemplary embodiment, the plurality of grinding whetstones D2 are arranged in the ring shape on an outer periphery portion of the bottom surface of the grinding wheel D1. However, the inventive concept of the present disclosure is not limited thereto. The grinding whetstones D2 may be fixed to the entire bottom surface of the grinding wheel D1. Further, when the inventive concept of the present disclosure is applied to a cutting apparatus instead of the grinding apparatus, a cutting tool is mounted to the moving unit 31 instead of the grinding tool D. It is enough to mount a processing tool configured to process the substrate W to the moving unit 31.

The moving unit 31 includes a flange 32 to which the grinding tool D is mounted; a spindle shaft 33 having the flange 32 provided at a lower end thereof; and a spindle motor 34 configured to rotate the spindle shaft 33. The flange 32 is disposed horizontally, and the grinding tool D is mounted to a bottom surface thereof. The spindle shaft 33 is vertically disposed. The spindle motor 34 rotates the spindle shaft 33, thus allowing the grinding tool D mounted on the flange 32 to be rotated. A rotation center line R3 of the grinding tool D is a rotation center line of the spindle shaft 33.

Further, the moving unit 31 may further include a spindle cover 35. The spindle cover 35 surrounds the spindle shaft 33 and suppresses adhesion of grinding debris to the spindle shaft 33. The spindle cover 35 includes a cylindrical member 36 surrounding the spindle shaft 33 and an upper flange member 37 formed at an upper end thereof. The upper flange member 37 is fixed to, for example, a motor holder 38. The motor holder 38 is configured to hold the spindle motor 34.

The grinding unit 30 is further equipped with an elevating unit 40 configured to move the moving unit 31 up and down. The elevating unit 40 includes, for example, a vertical Z-axis guide 41, a Z-axis slider 42 configured to be moved along the Z-axis guide 41, and a Z-axis motor 43 configured to move the Z-axis slider 42. The moving unit 31 is fixed to the Z-axis slider 42, and the moving unit 31 and the grinding tool D are moved up and down along with the Z-axis slider 42. The elevating unit 40 further includes a position detector 45 configured to detect the position of the grinding tool D. The position detector 45 detects, for example, the rotation of the Z-axis motor 43 to detect the position of the grinding tool D.

The elevating unit 40 lowers the grinding tool D from a standby position. The grinding tool D is rotated while being lowered, comes into contact with a top surface of the substrate W being rotated, and grinds the entire top surface of the substrate W. During the grinding of the substrate W, a grinding liquid is supplied to the top surface of the substrate W. When the thickness of the substrate W reaches a set value, the elevating unit 40 stops the lowering of the grinding tool D. Thereafter, the elevating unit 40 raises the grinding tool D up to the standby position.

The grinding apparatus 1 has a housing 50, a grinding liquid nozzle 60, and sprinklers 70. The housing 50 accommodates therein the rotary table 10, the chucks 20, the grinding tool D, the grinding liquid nozzle 60, and the sprinklers 70. The grinding liquid nozzle 60 is configured to supply the grinding liquid to a gap between the substrate W held by the chuck 20 and the grinding tool D. The sprinkler 70 is configured to sprinkle (spray) a cleaning liquid for cleaning the moving unit 31 from the outside of the moving unit 31 to which the grinding tool D is mounted.

The housing 50 suppresses the grinding debris, the grinding liquid, and the cleaning liquid from being scattered to the outside. The housing 50 has a top panel 51 forming a top surface thereof, and a side panel 52 forming a side surface thereof. The top panel 51 is provided with an insertion hole 53 for the moving unit 31. The housing 50 has therein a grinding chamber GR in which the grinding of the substrate W is performed. The housing 50 includes, at a lower portion thereof, a non-illustrated recovery pan. The recovery pan recovers the grinding debris, the grinding liquid and the cleaning liquid.

The grinding liquid nozzle 60 supplies the grinding liquid. The grinding liquid is, for example, pure water such as DIW (Deionized Water). The grinding liquid enters the gap between the substrate W and the grinding tool D, and reduces grinding resistance to thereby suppress heat generation.

For example, the grinding liquid nozzle 60 is disposed directly under the grinding tool D and at the outside of the substrate W in a diametrical direction thereof, and discharges the grinding liquid toward a space above the substrate W. The grinding liquid lands near the center of the top surface of the substrate W, and is diffused onto the entire top surface of the substrate W in the diametrical direction by the centrifugal force of the substrate W being rotated. Here, the layout of the grinding liquid nozzle 60 is not limited to the example shown in FIG. 2 and FIG. 3 as long as the grinding liquid can reach the gap between the substrate W and the grinding tool D.

The grinding liquid nozzle 60 is connected to a supply source 62 via a pipeline 61. An opening/closing valve 63 and a flow rate controller 64 are provided at a portion of the pipeline 61. If the opening/closing valve 63 opens a flow path of the pipeline 61, the grinding liquid is supplied from the supply source 62 to the grinding liquid nozzle 60, and is then discharged from the grinding liquid nozzle 60. The discharge amount of the grinding liquid is controlled by the flow rate controller 64. Meanwhile, if the opening/closing valve 63 blocks the flow path of the pipeline 61, the supply of the grinding liquid from the supply source 62 to the grinding liquid nozzle 60 is stopped, and the discharge of the grinding liquid is stopped.

The sprinkler 70 sprays the cleaning liquid for cleaning the moving unit 31 from the outside of the moving unit 31 to which the grinding tool D is mounted. Unlike the case of spraying the cleaning liquid from the grinding tool D as described in Patent Document 1, the grinding debris adhering to the moving unit 31 can be washed away. Therefore, when a worker or a working robot accesses the moving unit 31 for the maintenance of the grinding apparatus 1, contamination of the worker or the working robot can be suppressed. Furthermore, when the grinding chamber GR is opened, scattering of the grinding debris can be suppressed. Moreover, the grinding debris can be suppressed from falling onto the substrate W. In addition, when the inventive concept of the present disclosure is applied to a cutting apparatus, the sprinkler 70 washes cutting debris away. Here, the grinding debris, the cutting debris, and the like are referred to as processing debris all together. The processing debris are dust generated at the time of processing the substrate W.

The cleaning liquid is, for example, pure water such as DIW. The cleaning liquid may contain, in addition to the pure water, at least one selected from carbon dioxide, a microbubble, and ozone. The carbon dioxide dissolves in the pure water, and suppresses charging of the grinding debris to thereby suppress electrical adhesion of the grinding debris. The microbubble is a bubble smaller than 50 µm in diameter, and suppresses adhesion of the grinding debris by suppressing aggregation of the grinding debris with an explosive force generated when this bubble bursts. The ozone dissolves in the pure water, and contains a hydroxyl radical generated by a decomposition reaction. As the oxidation potential of the ozone rises, a cleaning effect can be expected.

The sprinkler 70 supplies the cleaning liquid to the spindle cover 35 and the like, and washes away the grinding debris adhering to the spindle cover 35. The sprinkler 70 also supplies the cleaning liquid to the flange 32. In addition, the moving unit 31 may not have the spindle cover 35. In this case, the sprinkler 70 supplies the cleaning liquid to the spindle shaft 33 and washes away the grinding debris adhering to the spindle shaft 33.

The sprinkler 70 is connected to a supply source 72 via a pipeline 71. An opening/closing valve 73 and a flow rate controller 74 are provided at a portion of the pipeline 71. If the opening/closing valve 73 opens a flow path of the pipeline 71, the cleaning liquid is supplied from the supply source 72 to the sprinkler 70, and is then discharged from the sprinkler 70. The discharge amount of the cleaning liquid is controlled by the flow rate controller 74. Meanwhile, if the opening/closing valve 73 closes the flow path of the pipeline 71, the supply of the cleaning liquid from the supply source 72 to the sprinkler 70 is stopped, and the discharge of the cleaning liquid is stopped.

The sprinkler 70 supplies the cleaning liquid not only to the moving unit 31 to which the grinding tool D is mounted, but also to the housing 50, thus allowing the grinding debris adhering to the housing 50 to be washed away. The sprinkler 70 may supply the cleaning liquid to the top panel 51 of the housing 50, or may supply the cleaning liquid to the side panel 52 of the housing 50. A discharge angle θ (see FIG. 3) of the cleaning liquid may be adjusted by a supply pressure of the cleaning liquid.

Figure 3:
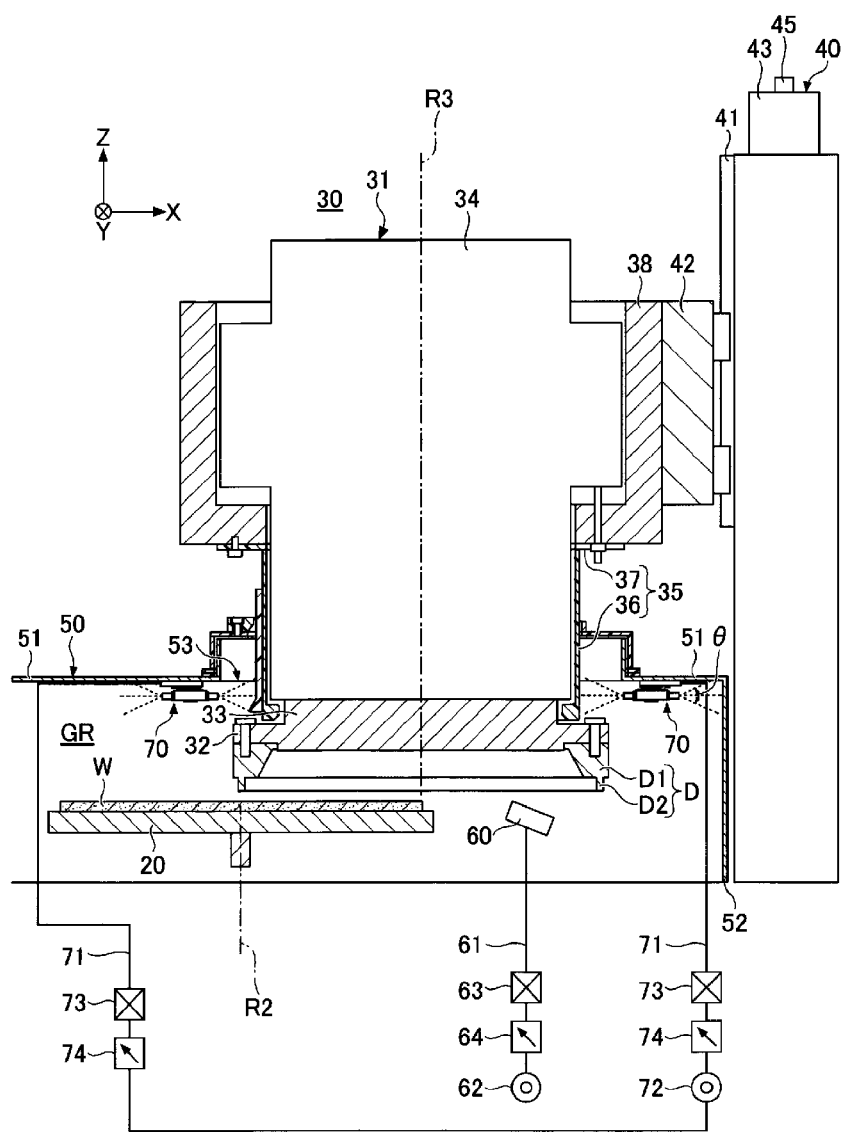
FIG. 3 is a cross sectional view of the main components of the grinding apparatus of FIG. 1, showing a state when cleaning is performed.

In addition, the layout and the number of the sprinklers 70 are not limited to the example shown in FIG. 2 and FIG. 3. At least one sprinkler 70 is disposed at each of the first grinding position A1, the second grinding position A2, and the third grinding position A3.

The cleaning by the sprinkler 70 is performed from the end of the grinding of the substrate W to the start of the rotation of the rotary table 10, for example. Accordingly, the grinding debris generated at, for example, the first grinding position can be suppressed from being moved from the first grinding position A1 to the second grinding position A2.

During the grinding of the substrate W, the spraying of the cleaning liquid by the sprinkler 70 may be prohibited. A change in a grinding result of the substrate W (for example, a distribution of the thickness of the substrate W, etc.) by the cleaning liquid can be suppressed. In particular, this is useful when the cleaning liquid and the grinding liquid contain different substances.

However, when a grinding characteristic of the substrate W does not change, the spraying of the cleaning liquid by the sprinkler 70 may be performed during the grinding of the substrate W. The cleaning liquid can be supplied to the moving unit 31 or the like during the grinding of the substrate W, so that the adhesion of the grinding debris to the moving unit 31 or the like can be more efficiently suppressed.

Furthermore, the cleaning by the sprinkler 70 may be performed immediately before the maintenance. The maintenance includes replacement of the grinding tool D. It is possible to suppress the contaminant from adhering to the worker or working robot during the maintenance.

Figure 4:
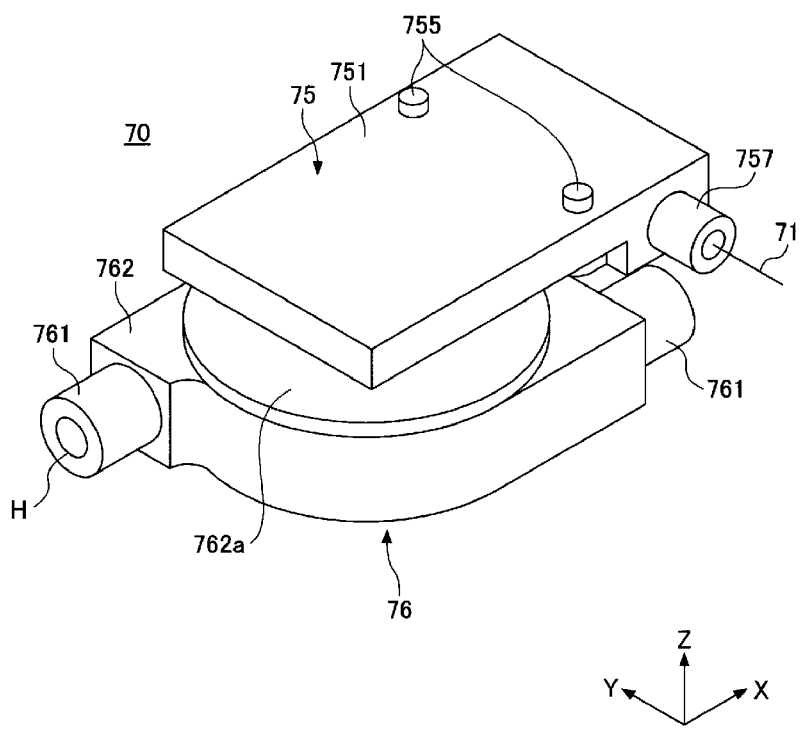
FIG. 4 is a perspective view illustrating an example of a sprinkler of FIG. 3.
Figure 5:
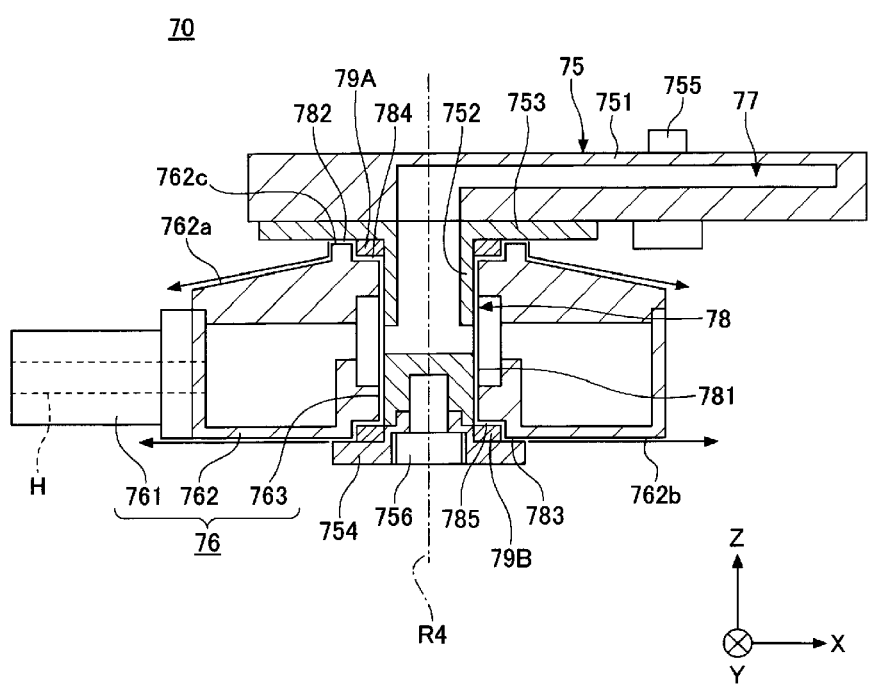
FIG. 5 is a cross sectional view of the sprinkler of FIG. 4.

Now, referring to FIG. 4 to FIG. 6, details of the sprinkler 70 will be explained. As depicted in FIG. 5, the sprinkler 70 includes a fixed unit 75 fixed to the inside of the housing 50, and a rotating unit 76 rotatably supported at the fixed unit 75. The rotating unit 76 includes a nozzle 761 configured to discharge the cleaning liquid, and a rotation block 762 configured to hold the nozzle 761. With this configuration, it is possible to discharge the cleaning liquid from the nozzle 761 while rotating the nozzle 761 along with the rotation block 762, so that the cleaning liquid can be discharged all around the circumferential direction of a rotation center line R4 of the rotation block 762. Therefore, contaminants in a wide range can be washed away.

The fixed unit 75 includes, by way of example, a mounting plate 751 mounted to the housing 50; a fixed shaft 752 disposed on the rotation center line R4 of the rotation block 762; a first gap forming portion 753 that forms a gap between the rotation block 762 and itself at one end of the fixed shaft 752; and a second gap forming portion 754 that forms a gap between the rotation block 762 and itself at the other end of the fixed shaft 752. The mounting plate 751 is detachably mounted to the housing 50 with a bolt 755 or the like. The mounting plate 751 is horizontally mounted to, for example, a bottom surface of the top panel 51 of the housing 50. The first gap forming portion 753 is fixed to the mounting plate 751 with a non-illustrated bolt or the like. The fixed shaft 752 protrudes vertically downwards from the first gap forming portion 753. Although the fixed shaft 752 is formed as one body with the first gap forming portion 753 herein, it may be formed separately from the first gap forming portion 753 and detachably mounted to the first gap forming portion 753. The second gap forming portion 754 is configured to fix the rotation block 762 at a lower end of the fixed shaft 752. The second gap forming portion 754 is detachably mounted to the fixed shaft 752 with a bolt 756 or the like. If the bolt 756 is removed, the rotating unit 76 can be taken out from the fixed shaft 752. As shown in FIG. 4, the mounting plate 751 is provided with a connection port 757 connected to the pipeline 71. The cleaning liquid is supplied from the connection port 757 of the fixed unit 75 to the nozzle 761 of the rotating unit 76, as will be described in detail later.

The rotating unit 76 includes the nozzle 761 configured to discharge the cleaning liquid, and the rotation block 762 configured to hold the nozzle 761. The nozzle 761 has a discharge port H for discharging the cleaning liquid. The nozzle 761 is mounted to the rotation block 762 in a replaceable manner. If several nozzles 761 having different shapes or sizes of the discharge port H are prepared in advance, a discharge angle or a discharging amount can be changed.

The rotation block 762 may have a plurality of mounting portions to which the nozzle 761 is attached. Instead of the nozzle 761, a non-illustrated stopper (not shown) may be mounted to the mounting portion. The discharging of the cleaning liquid can be stopped by the stopper. At least one nozzle 761 needs to be attached to the rotation block 762. The number and the layout of the nozzle 761 may be modified appropriately.

A through hole 763 is formed in the rotation block 762, and the fixed shaft 752 is disposed in the through hole 763. The rotation block 762 is rotated about the fixed shaft 752. If the rotation block 762 is rotated, the nozzle 761 is also rotated. The nozzle 761 sprays the cleaning liquid all around the circumferential direction of the fixed shaft 752 while being rotated about the fixed shaft 752.

Figure 6:
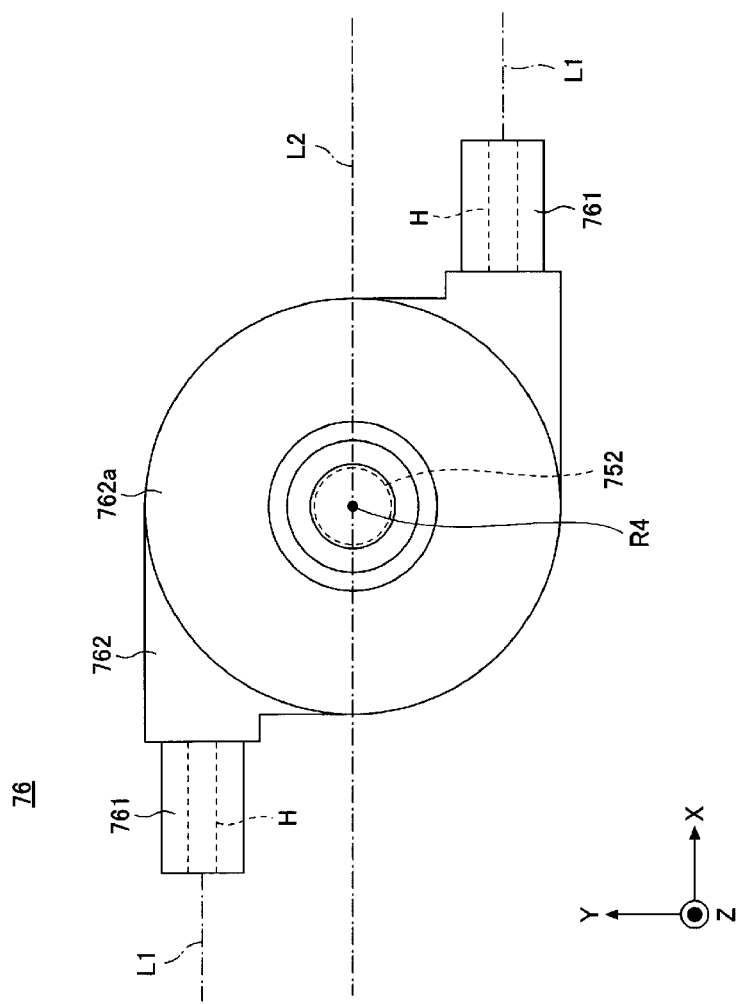
FIG. 6 is a plan view of a rotating unit of FIG. 4.

As illustrated in FIG. 6, when viewed from a direction parallel to the rotation center line R4 of the rotation block 762 (for example, the Z-axis direction), a discharge line L1 of the nozzle 761 lies parallel to an orthogonal line L2 to the rotation center line R4 while being deviated therefrom. The discharge line L1 is an extension line of the discharge port H of the nozzle 761. If the nozzle 761 discharges the cleaning liquid, a reaction force is generated in a direction opposite to a discharging direction. Since the reaction force is deviated parallel to the orthogonal line L2 to the rotation center line R4, a torque is generated, so that the rotation block 762 is rotated. Since a motor for rotating the rotation block 762 is not necessary, the sprinkler 70 can be scaled down.

A plurality of nozzles 761 may be disposed rotationally symmetrically around the rotation center line R4 of the rotation block 762. A plurality of reaction forces are generated rotationally symmetrically around the rotation center line R4. If these reaction forces are generated rotationally symmetrically, a radial load applied to the fixed shaft 752 may be canceled, so that damage to the fixed shaft 752 can be suppressed. The plurality of nozzles 761 arranged rotationally symmetrically may have the same discharge angle θ. Further, as will be described in detail later, the same effect can be obtained even when a rotation shaft is provided instead of the fixed shaft 752.

Moreover, in the present exemplary embodiment, a protruding portion (fixed shaft 752) is disposed in the fixed unit 75, a recessed portion (through hole 763) is disposed in the rotating unit 76, and the protruding portion and the recessed portion are rotatably fitted. Here, however, the arrangement of the protruding portion and the recessed portion may be reversed. By way of example, the through hole may be formed at the fixed portion 75, and the rotation shaft of the rotating unit 76 may be disposed in this through hole. The rotation shaft is provided at the rotation block 762.

As depicted in FIG. 5, the sprinkler 70 has a first flow path 77 through which the cleaning liquid is supplied from the fixed unit 75 to the nozzle 761 via the rotation block 762. The first flow path 77 is connected to the pipeline 71 shown in FIG. 4, and is formed across the connection port 757, the mounting plate 751, the first gap forming portion 753, the fixed shaft 752, the rotation block 762, and the nozzle 761.

The sprinkler 70 has a second flow path 78 branched off from the first flow path 77 to allow the cleaning liquid to leak from a gap between the fixed unit 75 and the rotation block 762. After the cleaning liquid flows vertically downwards within the fixed shaft 752, it flows outwards in a radial direction of the fixed shaft 752 and leaks from the gap between the fixed shaft 752 and the rotation block 762.

The second flow path 78 includes a cylindrical portion 781 centered on the rotation center line R4 of the rotation block 762. The cylindrical portion 781 is formed around, for example, the fixed shaft 752, and forms a cylindrical liquid film around the fixed shaft 752. This liquid film may suppress a contact between the fixed shaft 752 and the rotation block 762, so that a friction loss can be reduced.

Further, when a rotating shaft is provided instead of the fixed shaft 752, the cylindrical portion 781 is formed around the rotating shaft, and a cylindrical liquid film is formed around the rotating shaft. This liquid film may suppress the contact between the rotating shaft and the fixed unit, so that the friction loss can be reduced.

The rotation center line R4 of the rotation block 762 is vertically disposed, and the second flow path 78 includes a first supply portion 782 configured to supply the cleaning liquid to a top surface 762a of the rotation block 762. A protruding portion 762c is provided on the top surface 762a of the rotation block 762, and a gap formed between the protruding portion 762c and the first gap forming portion 753 is the first supply portion 782. Further, the protruding portion 762c may be formed on a bottom surface of the first gap forming portion 753 instead of the top surface 762a of the rotation block 762. In addition, the protruding portion 762c may not be necessary. Either way, grinding debris adhering to the top surface 762a of the rotation block 762 can be washed away by the first supply portion 782.

The first supply portion 782 is formed in a ring shape above the cylindrical portion 781, for example, and is disposed at an outside of the cylindrical portion 781 in the diametrical direction thereof. The cleaning liquid is supplied from an upper end of the cylindrical portion 781 to the top surface 762a of the rotation block 762 through the first supply portion 782.

The top surface 762a of the rotation block 762 includes a conical surface that is inclined vertically downwards as it goes outwards in the diametrical direction from the rotation center line R4 of the rotation block 762. The cleaning liquid supplied to the conical surface flows radially and falls down due to gravity. The cleaning can be uniformly distributed around the rotation center line R4.

The second flow path 78 includes a second supply portion 783 configured to supply the cleaning liquid to a bottom surface 762b of the rotation block 762. By the second supply portion 783, grinding debris adhering to the bottom surface 762b of the rotation block 762 can be washed away.

The second supply portion 783 is formed in a ring shape below the cylindrical portion 781, for example, and is disposed at an outside of the cylindrical portion 781 in the diametrical direction thereof. The cleaning liquid is supplied from the lower end of the cylindrical portion 781 to the bottom surface 762b of the rotation block 762 through the second supply portion 783.

The sprinkler 70 is equipped with adjusting members 79A and 79B configured to adjust a distribution ratio between a flow rate of the cleaning liquid discharged by the nozzle 761 and a flow rate of the cleaning liquid leaking from the gap between the fixed unit 75 and the rotation block 762. By the adjusting members 79A and 79B, a sufficient liquid pressure can be generated between the fixed unit 75 and the rotation block 762, and the cleaning liquid can be discharged from the nozzle 761 at a sufficient flow rate.

The adjusting members 79A and 79B are disposed in, for example, the second flow path 78. The plurality of adjusting members 79A and 79B having different thicknesses in a width direction of the second flow path 78 (for example, in the Z-axis direction) are prepared. With a decrease of the thicknesses of the adjusting members 79A and 79B, flow resistance of the second flow path 78 becomes smaller, the flow rate in the second flow path 78 increases, and the flow rate of the first flow path 77 decreases. Therefore, if the thickness of at least one of the adjusting members 79A and 79B is changed, the distribution ratio between the flow rate of the first flow path 77 and the flow rate of the second flow path 78 can be changed. When changing the thickness of the adjusting members 79A and 79B, the bolt 756 would be removed, and the rotating unit 76 would be taken out from the fixed shaft 752.

Further, instead of preparing the plurality of adjusting members 79A and 79B having the different thicknesses, the thicknesses of the adjusting members 79A and 79B may be reduced by cutting the adjusting members 79A and 79B, or the thicknesses of the adjusting member 79A and 79B may be increased by pasting a shim to the adjusting members 79A and 79B.

The second flow path 78 has a first intermediate portion 784 between the cylindrical portion 781 and the first supply portion 782, and the adjusting member 79A is disposed in the first intermediate portion 784. The adjusting member 79A is formed in a ring shape, and the fixed shaft 752 is disposed in a through hole of the adjusting member 79A. The first intermediate portion 784 is formed between the first gap forming portion 753 and the rotation block 762. The adjusting member 79A does not have to be fixed to either of the first gap forming portion 753 and the rotation block 762 for the sake of easy replacement thereof.

Further, the second flow path 78 has a second intermediate portion 785 between the cylindrical portion 781 and the second supply portion 783, and the adjusting member 79B is disposed in the second intermediate portion 785. The adjusting member 79B is formed in a ring shape, and the fixed shaft 752 is disposed in a through hole of the adjusting member 79B. The second intermediate portion 785 is formed between the second gap forming portion 754 and the rotation block 762. The adjusting member 79B does not need to be fixed to either of the second gap forming portion 754 and the rotation block 762 for the sake of easy replacement thereof.

Based on a balance between the thickness of the adjusting member 79A disposed in the first intermediate portion 784 and the thickness of the adjusting member 79B disposed in the second intermediate portion 785, the distribution ratio between the flow rate of the first supply portion 782 and the flow rate of the second supply portion 783 is determined. Therefore, if the thickness of at least one of the adjusting members 79A and 79B is changed, the distribution ratio between the flow rate of the first supply portion 782 and the flow rate of the second supply portion 783 can be changed. In addition, if it is not required to change the distribution ratio between the flow rate of the first supply portion 782 and the flow rate of the second supply portion 783, either one of the adjusting members 79A and 79B may be omitted. Additionally, when it is unnecessary to adjust the distribution ratio between the flow rate of the cleaning liquid discharged by the nozzle 761 and the flow rate of the cleaning liquid leaking from the gap between the fixed unit 75 and the rotation block 762, both the adjusting members 79A and 79B may be omitted.

Figure 7:
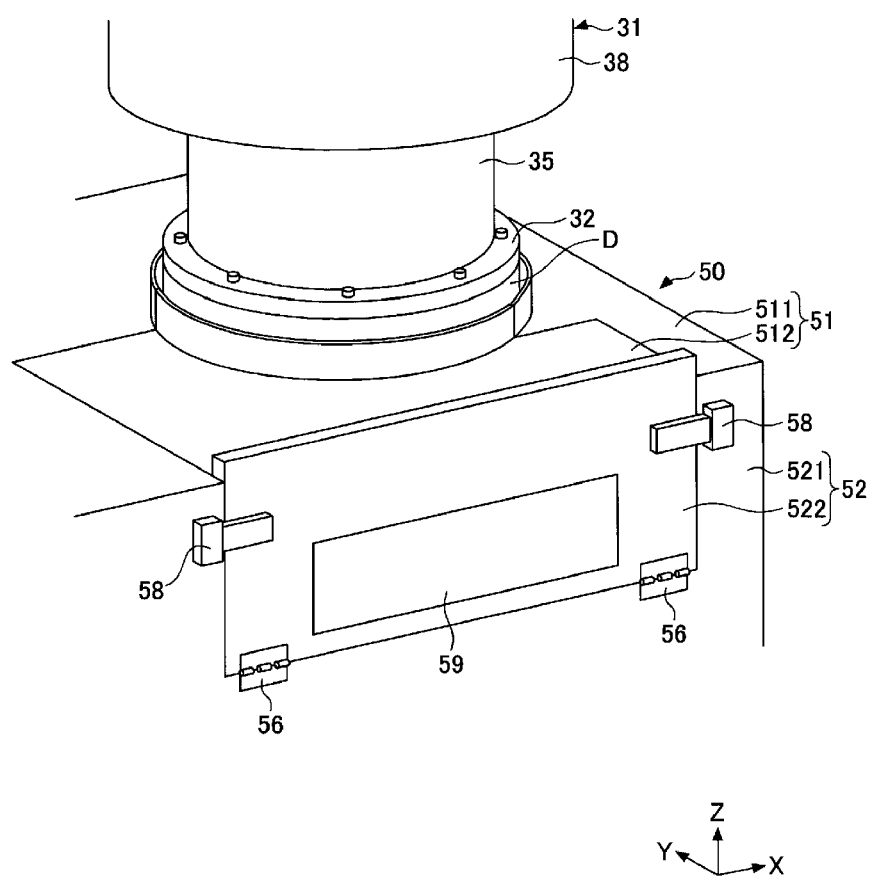
FIG. 7 is a perspective view illustrating an example state of a housing when the grinding and the cleaning are performed.
Figure 8:
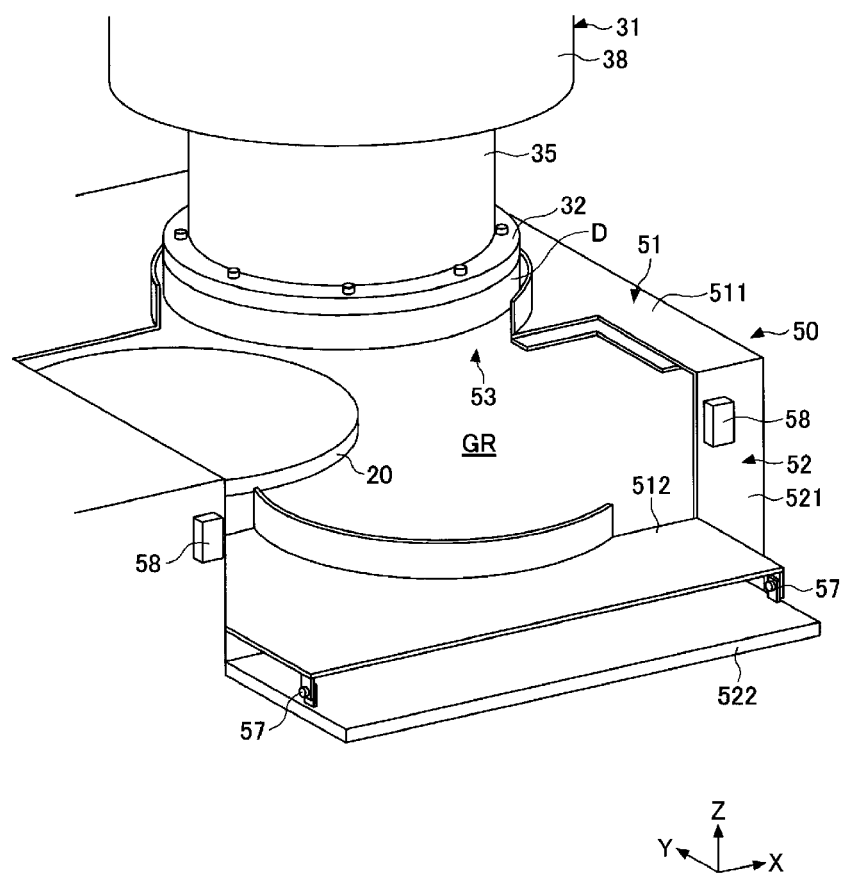
FIG. 8 is a perspective view illustrating an example state of the housing when maintenance is performed.

Now, referring to FIG. 7 to FIG. 8, the housing 50 will be elaborated. The housing 50 has the top panel 51 forming the top surface of the housing 50 and the side panel 52 forming the side surface of the housing 50. The side panel 52 includes a side fixed portion 521 fixed vertically, and a side moving portion 522 connected to the side fixed portion 521 by a first hinge 56. Meanwhile, the top panel 51 includes a top fixed portion 511 fixed horizontally, and a top moving portion 512 connected to the side moving portion 522 by a second hinge 57. The top fixed portion 511 and the top moving portion 512 are divided along the insertion hole 53 of the moving unit 31.

As shown in FIG. 7, when the grinding and the cleaning are performed, the top moving portion 512 is disposed on a level with the top fixed portion 511, and the side moving portion 522 is disposed on a level with the side fixed portion 521. This state is locked by lock mechanisms 58. An opening window is formed at the side moving portion 522, and the opening window is closed with a transparent plate 59. The grinding chamber GR can be visually observed through the transparent plate 59.

Meanwhile, as shown in FIG. 8, during the maintenance, the locking of the lock mechanisms 58 is released, and the side moving portion 522 is opened to the outside of the grinding chamber GR, and the top moving portion 512 and the side moving portion 522 are folded horizontally. As a result, the grinding chamber GR is opened.

As illustrated in FIG. 8, the grinding chamber GR can be opened largely at the time of the maintenance, and, particularly, the vicinity of the insertion hole 53 of the moving unit 31 can be widely opened. Therefore, it is easy for the worker or the working robot to access the grinding tool D attached to the moving unit 31, which eases the maintenance work.

Next, with reference to FIG. 9 to FIG. 10, a positional relationship of the sprinkler 70, the top moving portion 512, and the side moving portion 522 will be explained.

Figure 9:
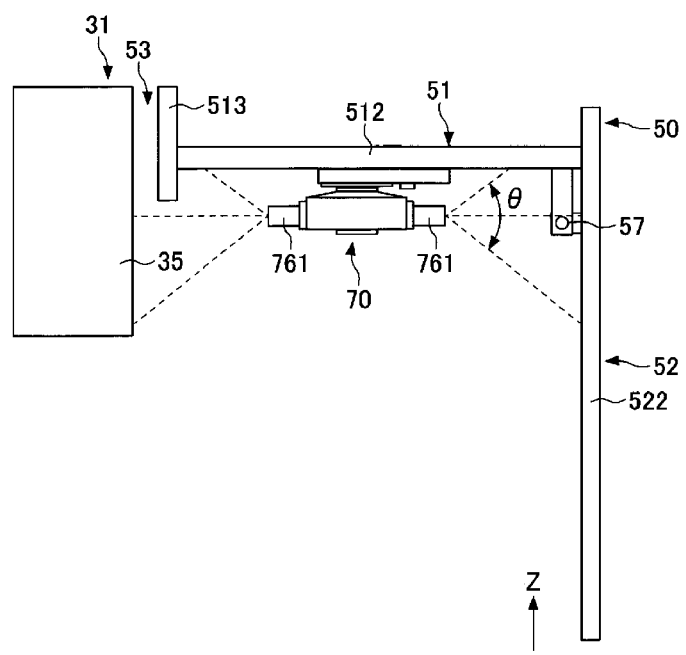
FIG. 9 is a cross sectional view illustrating an example layout of the sprinkler, a top moving portion and a side moving portion when the cleaning is performed.

As depicted in FIG. 9, when the cleaning is performed, the sprinkler 70 supplies the cleaning liquid to the moving unit 31, the top moving portion 512, and the side moving portion 522. The sprinkler 70 is mounted to, for example, the top moving portion 512.

Furthermore, the sprinkler 70 only needs to supply the cleaning liquid to the moving unit 31. Further, the sprinkler 70 may supply the cleaning liquid to only either one of the top moving portion 512 and the side moving portion 522. The plurality of nozzles 761 having the different discharge angles $\theta$ may be mounted to the single rotation block 762 such that the cleaning liquid is efficiently supplied to both the top moving portion 512 and the side moving portion 522.

For example, one nozzle 761 has a large discharge angle $\theta$ in the vertical direction in order to efficiently supply the cleaning liquid to the top moving portion 512, and another nozzle 761 has a small discharge angle $\theta$ in the vertical direction to efficiently supply the cleaning liquid to the side moving portion 522. If the discharge angle $\theta$ in the vertical direction is small so the cleaning liquid hardly diffuses in the vertical direction, the cleaning liquid does not collide with the top moving portion 512 and flies away. The another nozzle 761 needs to have a small discharge angle θ in the vertical direction, and may have a large discharge angle in the horizontal direction and discharge the cleaning liquid in a horizontal fan shape.

The discharge angle θ of the nozzle 761 can be changed by changing a rotation angle centered on the discharge line L1 of the nozzle 761, or by replacing the nozzle 761 with a different discharge port H. When the discharge port H of the nozzle 761 has a slit shape, if the nozzle 761 is rotated about the discharge line L1 of the nozzle 761, the discharge angle θ in the vertical direction or the horizontal direction are changed. In addition, the sprinklers 70 may have nozzles of different discharge angles θ. The discharge angle θ is selected according to a target member to be cleaned such that the target member can be cleaned efficiently.

The worker or the working robot rotates, during the maintenance, the side moving portion 522 about the first hinge 56 and rotates the top moving portion 512 about the second hinge 57 in order to open the grinding chamber GR. At this time, the worker or the working robot may come into contact with the top moving portion 512 or the side moving portion 522.

According to the present exemplary embodiment, the sprinkler 70 supplies the cleaning liquid not only to the moving unit 31, but also to the top moving portion 512 or the side moving portion 522. Accordingly, it is possible to remove a contaminant of the top moving portion 512 or the side moving portion 522, so that the contaminant from the top moving portion 512 or the side moving portion 522 may be suppressed from adhering to the worker or the working robot.

Figure 10:
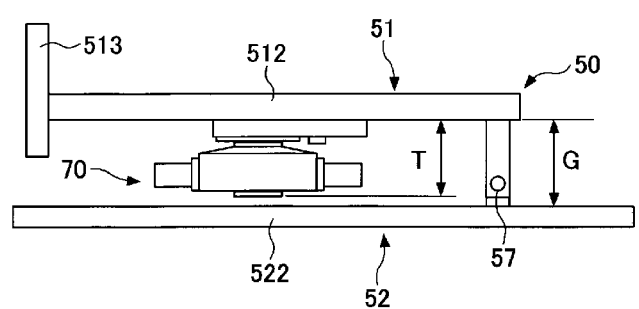
FIG. 10 is a cross sectional view illustrating an example layout of the sprinkler, the top moving portion and the side moving portion when the maintenance is performed.
Figure 11:
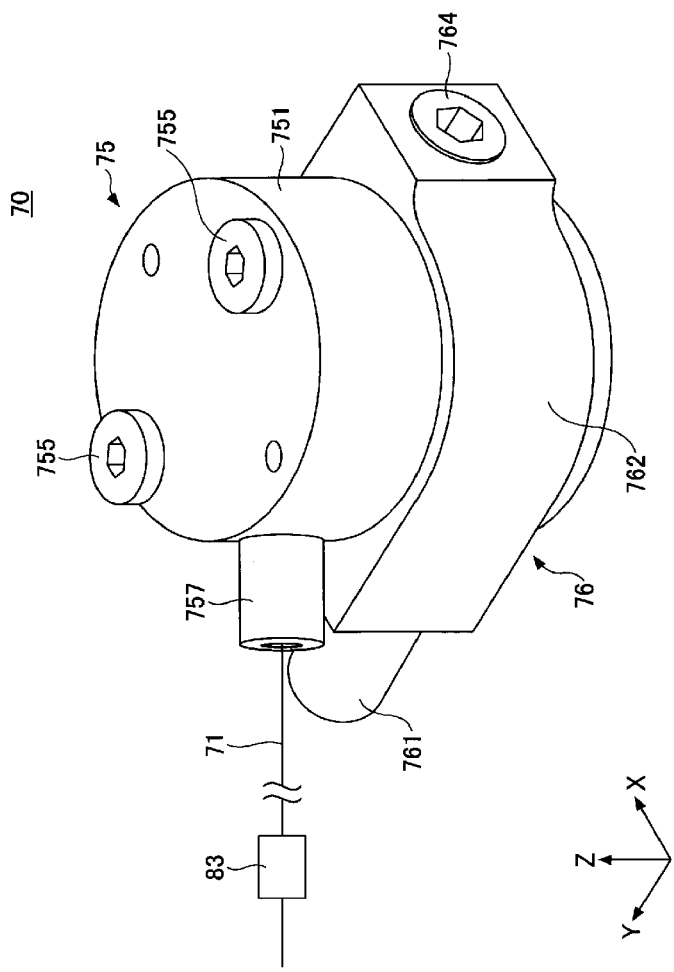
FIG. 11 is a perspective view illustrating a sprinkler according to a modification example.

As shown in FIG. 10, in the maintenance, the top moving portion 512 and the side moving portion 522 are folded horizontally. At this time, a thickness T of the sprinkler 70 is smaller than a gap G between the top moving portion 512 and the side moving portion 522, and the sprinkler 70 is disposed in the gap G. In the state that the sprinkler 70 is mounted to the top moving portion 512, the grinding chamber GR can be opened or closed.

In addition, although the sprinkler 70 is fixed to the top moving portion 512 in this exemplary embodiment, it may be mounted to the top fixed portion 511. It is enough to place the sprinkler 70 at a position where it supplies the cleaning liquid to the moving unit 31 at least. Further, one or more sprinklers 70 may be mounted to the top moving portion 512 and the top fixed portion 511.

However, as shown in FIG. 9, the top panel 51 may have a scattering suppressing portion 513 configured to suppress the cleaning liquid from scattering to the outside of the housing 50 via the insertion hole 53 of the moving unit 31. The scattering suppressing portion 513 is formed along the insertion hole 53 of the moving unit 31. The scattering suppressing portion 513 is protruded downwards from a bottom surface of the top moving portion 512. Further, the scattering suppressing portion 513 is also protruded upwards from a top surface of the top moving portion 512.

A controller 90 shown in FIG. 1 is, for example, a computer, and includes a CPU 91 and a recording medium 92 such as a memory. The recording medium 92 stores therein a program for controlling various processings performed in the grinding apparatus 1. The controller 90 controls the operation of the grinding apparatus 1 by causing the CPU 91 to execute the program stored in the recording medium 92.

Now, referring to FIG. 11 to FIG. 14, a sprinkler 70 according to a modification example will be described. As depicted in FIG. 13, the sprinkler 70 includes a fixed unit 75 fixed to the inside of the housing 50, and a rotating unit 76 rotatably supported at the fixed unit 75. The rotating unit 76 includes a nozzle 761 configured to discharge the cleaning liquid, and a rotation block 762 configured to hold the nozzle 761. The nozzle 761 discharges the cleaning liquid while being rotated along with the rotation block 762. Therefore, the cleaning liquid can be discharged all around the circumferential direction of a rotation center line R4 of the rotation block 762, so that contaminants in a wide range can be washed away.

The fixed unit 75 includes, by way of example, a mounting plate 751 mounted to the housing 50, and a fixed shaft 752 disposed on the rotation center line R4 of the rotation block 762. The mounting plate 751 is detachably mounted to the top panel 51 of the housing 50 with a bolt 755 or the like. The mounting plate 751 is of, for example, a disk shape. The mounting plate 761 is provided with a bolt hole into which the bolt 755 is screwed. The mounting plate 751 is horizontally mounted to the bottom surface of the top panel 51 of the housing 50, for example.

The fixed shaft 752 is formed as one body with the mounting plate 751 and protruded vertically downwards from the mounting plate 751. A stopper 754 for pulling out and stopping the rotation block 762 is provided at a lower end of the fixed shaft 752. The stopper 754 is, for example, a bolt, and is detachably mounted to the fixed shaft 752. If the stopper 754 is removed, the rotating unit 76 can be taken out from the fixed shaft 752.

The fixed unit 75 includes a ring 758 protruded downwards from a periphery of a bottom surface of the mounting plate 751 and surrounding the fixed shaft 752. The ring 758 has, by way of non-limiting example, an annular shape. The ring 758 suppresses grinding debris from reaching a gap between the horizontal bottom surface of the mounting plate 751 and the horizontal top surface of the rotation block 762, thus suppressing the grinding debris from being drawn into a gap between a bearing 765 of the rotation block 762 and the rotation shaft 752.

The rotating unit 76 includes the nozzle 761 and the rotation block 762. The nozzle 761 has a discharge port H for discharging the cleaning liquid. The nozzle 761 is mounted to the rotation block 762 in a replaceable manner. If several nozzles 761 having different shapes or sizes of the discharge port H are prepared in advance, a discharge angle or a discharging amount can be changed.

Figure 12:
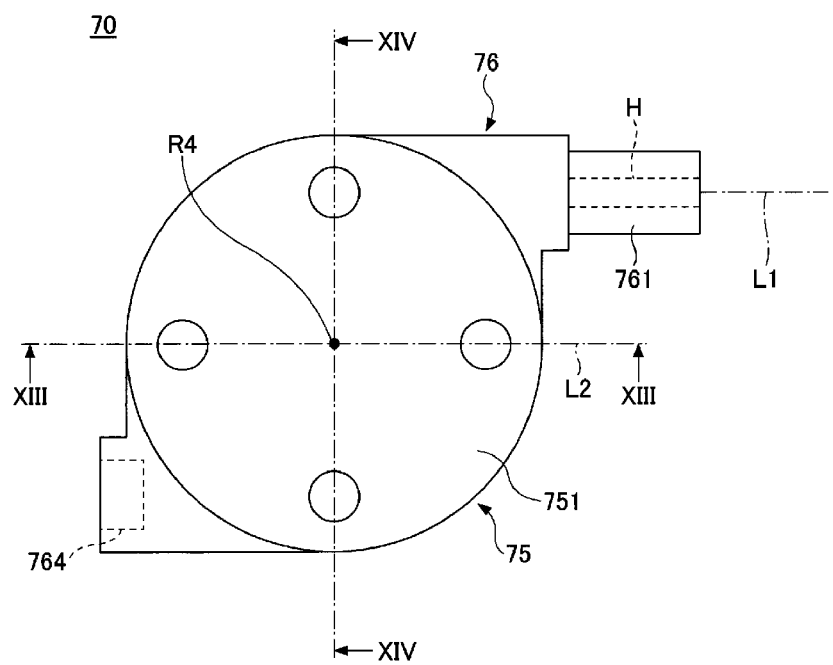
FIG. 12 is a plan view illustrating the sprinkler according to the modification example.
Figure 12:
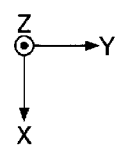
Figure 13:
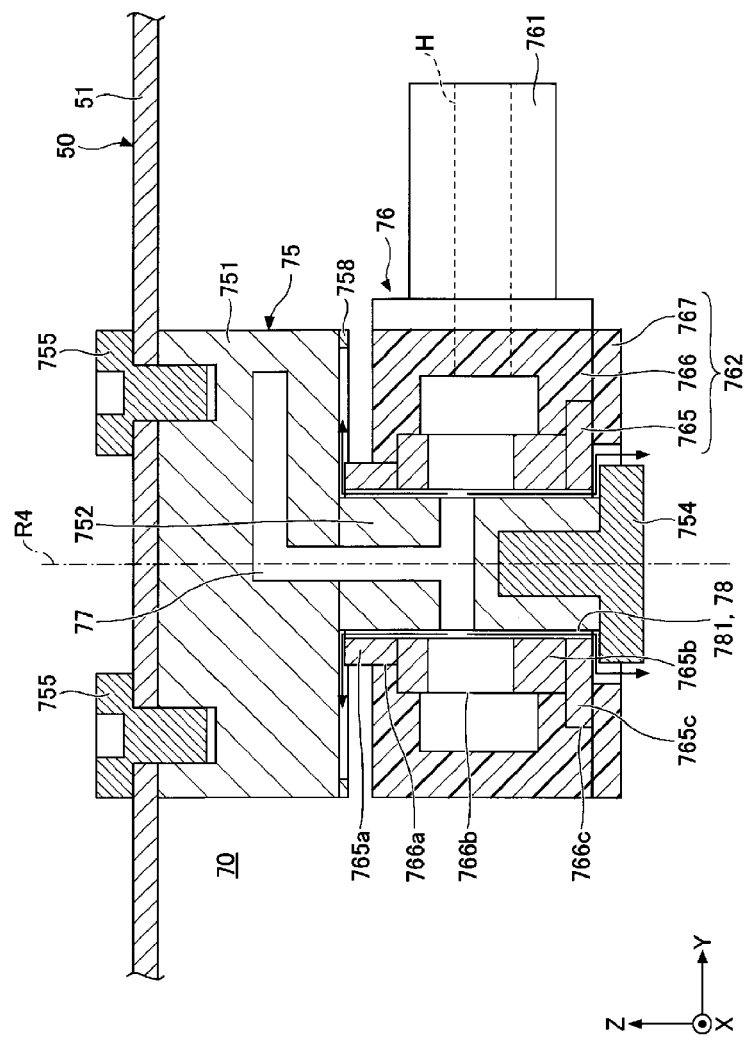
FIG. 13 is a cross sectional view of the sprinkler, taken along a line XIII-XIII of FIG. 12.

As depicted in FIG. 12, a discharge line L1 of the nozzle 761 lies parallel to an orthogonal line L2 to the rotation center line L4 while being deviated therefrom. If the nozzle 761 discharges the cleaning liquid, a reaction force is generated in a direction opposite to a discharging direction. A torque is generated by the reaction force, rendering the rotation block 762 rotated. Since a motor for rotating the rotation block 762 is not necessary, the sprinkler 70 can be scaled down.

The rotating unit 76 may have a counter weight 764 on the opposite side from the nozzle 761 with reference to the rotation center line R4 of the rotation block 762. As compared to a case where there is no counter weight 764, the center of the rotating unit 76 may be positioned closer to the rotation center line R4. As a result, friction between the bearing 765 of the rotation block 762 and the fixed shaft 752 can be reduced, so that the rotation block 762 can be rotated smoothly.

The counter weight 764 has the same weight as the nozzle 761. By way of example, the weight of the counter weight 764 is equivalent to 90% to 110% of the weight of the nozzle 761. The counter weight 764 may be formed of a material having density higher than that of the nozzle 761. For example, the material of the nozzle 761 may be a resin, and the material of the counterweight 764 may be a metal. The counter weight 764 can be downsized.

The counter weight 764 may be provided so as to be replaced with the nozzle 761. In case that the counter weight 764 is provided instead of the nozzle 761, the counter weight 764 also serves as a stopper for stopping the discharging of the cleaning liquid. Since the number of the nozzles 761 included in one sprinkler 70 is reduced, the amount of the cleaning liquid sprayed by one sprinkler 70 can be reduced. As a result, even if the number of the sprinklers 70 is increased to clean various places within the housing 50, the total amount of the cleaning liquid can be suppressed. Arrangement positions of the sprinklers 70 will be described later.

As depicted in FIG. 13, the rotation block 762 includes the bearing 765 that receives the fixed shaft 752, and a receptacle 766 that collects the cleaning liquid around the bearing 765. The bearing 765 has a cylindrical shape, and the fixed shaft 752 is inserted therethrough. Each of the bearing 765 and the fixed shaft 752 is formed of a metal from a viewpoint of durability. Meanwhile, the receptacle 766 is formed of a resin from a viewpoint of weight reduction. The bearing 765 is press-fitted into a fitting hole of the receptacle 766 to be fixed.

The bearing 765 includes, for example, a first cylindrical portion 765a, a second cylindrical portion 765b having a larger outer diameter than the first cylindrical portion 765a, and a third cylindrical portion 765c having a larger outer diameter than that of the second cylindrical portion 765b in this order, coaxially. The first cylindrical portion 765a, the second cylindrical portion 765b, and the third cylindrical portion 765c have the same inner diameter. The inner diameter is larger than the outer diameter of the fixed shaft 752.

The receptacle 766 has a disk shape, for example, and rounds has the same outer diameter as the mounting plate 751. A fitting hole for insertion-fitting the bearing 765 is formed at the center of the receptacle 766. The fitting hole includes a first fitting hole 766a for insertion-fitting the first cylindrical portion 765a, a second fitting hole 766b for insertion-fitting the second cylindrical portion 765b, and a third fitting hole 766c for insertion-fitting the third cylindrical portion 765c in this order, coaxially. The second fitting hole 766b has a hole diameter larger than that of the first fitting hole 766a, and the third fitting hole 766c has a diameter larger than that of the second fitting hole 766b.

A step-shaped surface between the first fitting hole 766a and the second fitting hole 766b presses a top surface of the second cylindrical portion 765b. Further, a step-shaped surface between the second fitting hole 766b and the third fitting hole 766c presses a top surface of the third cylindrical portion 765c. Furthermore, a lid 767 presses a bottom surface of the third cylindrical portion 765c. Like the receptacle 766, the lid 767 is formed of a resin and welded to the receptacle 766. Since the lid 767 and the receptacle 766 are integrated, it is possible to suppress the bearing 765 from being separated from the receptacle 766.

The sprinkler 70 has a first flow path 77 for supplying the cleaning liquid from the fixed unit 75 to the nozzle 761 via the rotation block 762. The first flow path 77 is connected to the pipeline 71 (see FIG. 11), and is formed across a connection port 757, a mounting plate 751, the fixed shaft 752, the bearing 765, the receptacle 766, and the nozzle 761.

The sprinkler 70 has a second flow path 78 branched off from the first flow path 77 to allow the cleaning liquid to leak from a gap between the fixed unit 75 and the rotation block 762. After the cleaning liquid flows within the fixed shaft 752 along the axial direction of the fixed shaft 752, it flows outwards in the radial direction of the fixed shaft 752 and leaks from the gap between the fixed shaft 752 and the rotation block 762.

The second flow path 78 includes a cylindrical portion 781 centered on the rotation center line R4 of the rotation block 762. The cylindrical portion 781 is formed around, for example, the fixed shaft 752, and forms a cylindrical liquid film around the fixed shaft 752. This liquid film may suppress a contact between the fixed shaft 752 and the bearing 765, so that a friction loss can be reduced.

As mentioned above, the nozzle 761 of the sprinkler 70 discharges the cleaning liquid while being rotated along with the rotation block 762. Therefore, the cleaning liquid can be discharged all around the circumferential direction of the rotation center line R4 of the rotation block 762, so that contaminants in a wide range can be washed away. Meanwhile, when the rotation of the rotation block 762 is stopped due to the frictional resistance or the like, the nozzle 761 discharges the cleaning liquid only in a specific direction.

Figure 14:
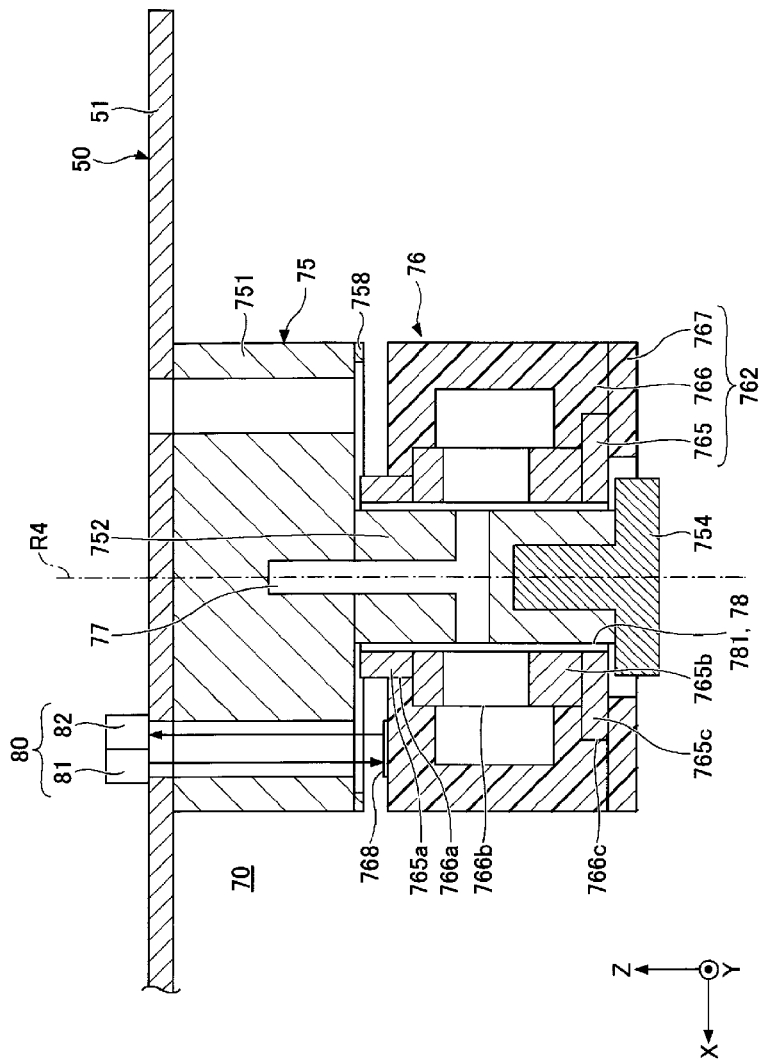
FIG. 14 is a cross sectional view of the sprinkler, taken along a line XIV-XIV of FIG. 12.

As a resolution, as depicted in FIG. 14, the grinding apparatus 1 may have a rotation stop detector 80 configured to detect a stop of the rotation of the rotating unit 76 of the sprinkler 70. Even if the rotation of the rotation block 762 is stopped when the nozzle 761 discharges the cleaning liquid, the maintenance of the sprinkler 70 can be accelerated if the stop of the rotation of the rotation block 762 is detected by the rotation stop detector 80.

The rotation stop detector 80 is disposed outside the housing 50. By disposing the rotation stop detector 80 at the outside of the housing 50, it is possible to suppress the rotation stop detector 80 from being contaminated by the grinding residue, or damaged. Further, by disposing the rotation stop detector 80 at the outside of the housing 50, it becomes easy to handle electrical wiring. By way of example, the rotation stop detector 80 may be disposed on the top panel 51 of the housing 50.

While the rotation stop detector 80 is disposed outside the housing 50, the sprinkler 70 is disposed inside the housing 50. The rotation stop detector 80 and the sprinkler 70 are distanced apart from each other. For the reason, the rotation stop detector 80 has, for example, a light emitter 81 and a light receiver 82 in order to detect the stop of the rotation of the rotating unit 76 of the sprinkler 70.

The rotating unit 76 of the sprinkler 70 includes a light reflecting member 768 configured to reflect light of the light emitter 81 to the light receiver 82. For example, the light reflecting member 768 is provided on the top surface of the rotation block 762 which is horizontal, and it may reflect the light vertically. A plurality of light reflecting members 768 may be arranged around the rotation center line R4 of the rotation block 762 at a certain distance therebetween.

A through hole, which is a passage for the light, is formed at each of the fixed unit 75 of the sprinkler 70 and the housing 50. By way of example, a through hole as a light passage is formed at each of the mounting plate 751 of the sprinkler 70 and the top panel 51 of the housing 50.

The rotation stop detector 80 detects a light-receiving cycle in which the light receiver 82 receives the light reflected by the light reflecting member 768. The rotation stop detector 80 detects the stop of the rotation of the rotating unit 76 by detecting that the light-receiving cycle of the light receiver 82 exceeds a threshold value. Further, the rotation stop detector 80 may also detect the number of rotations of the rotating unit 76 based on the light-receiving cycle of the light receiver 82. With an increase of the number of rotations of the rotating unit 76, the light-receiving cycle of the light receiver 82 may become shorter.

In addition, the configuration of the rotation stop detector 80 is not limited to the above-described example. By example of example, the rotation stop detector 80 may include a pressure detector 83 (see FIG. 11). The pressure detector 83 is provided at a portion of the pipeline 71 and detects the pressure of the cleaning liquid. When the rotation of the rotation block 762 is stopped due to frictional resistance or the like, the pressure of the cleaning liquid changes. Accordingly, if the change in the pressure of the cleaning liquid is detected, the stop of the rotation of the rotation block 762 can be detected. Since the pressure detector 83 is provided at a portion of the pipeline 71, it can be located outside the housing 50.

Figure 15:
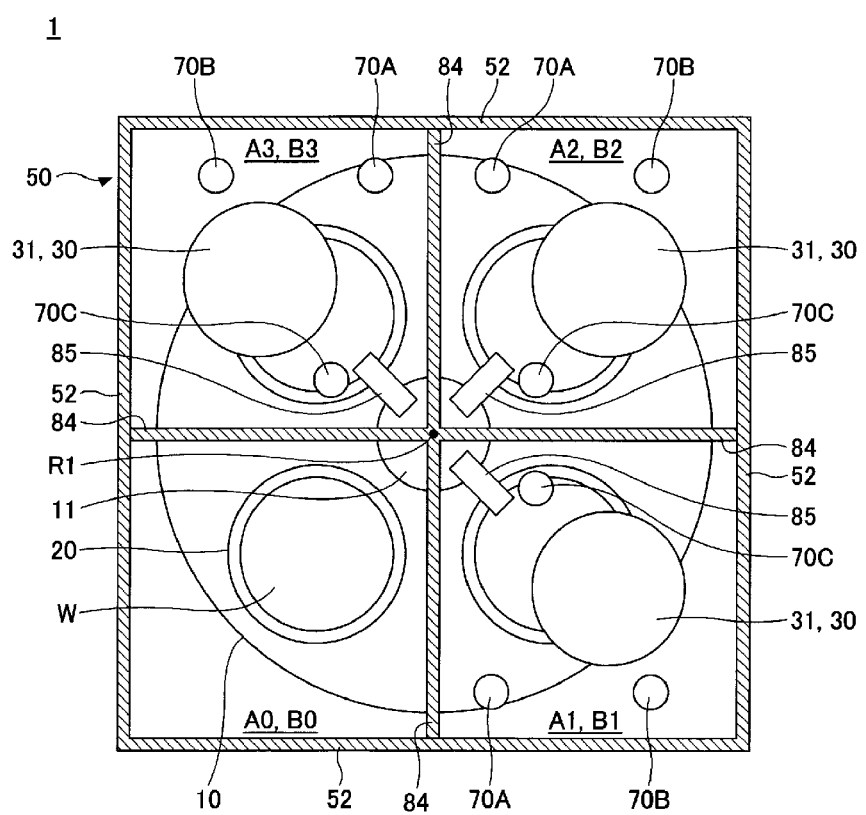
FIG. 15 is a plan view illustrating a layout of the sprinkler according to the modification example.

As depicted in FIG. 15, the grinding apparatus 1 is equipped with a fixed partition wall 84 that partitions the inside of the housing 50 into a plurality of rooms around the rotation center line R1 of the rotary table 10. The fixed partition wall 84 is fixed to the bottom surface of the top panel 51. When viewed from the top, the fixed partition wall 84 extends in the diametrical direction of the rotary table 10 (in the direction orthogonal to the rotation center line R1).

The fixed partition wall 84 is provided in, for example, a cross shape, and partitions the inside of the housing 50 into four rooms B0 to B3 around the rotation center line R1 of the rotary table 10. The three rooms B1 to B3 are grinding chambers in which the substrate W is ground. The room B1 is a first grinding chamber; the room B2, a second grinding chamber; and the room B3, a third grinding chamber. The last one room B0 is a carry-in/out room in which the substrate W is carried in or out. The carrying-in/out of the substrate W includes transferring the substrate W by an external transfer device and the chuck 20.

When viewed from the top, the inside of the housing 50 is partitioned into the carry-in/out chamber B0, the first grinding chamber B1, the second grinding chamber B2, and the third grinding chamber B3 in this order in a counter-clockwise direction. Further, the order of the four rooms B0 to B3 may be reversed, and when viewed from the top, the inside of the housing 50 may be partitioned into the carry-in/out chamber B0, the first grinding chamber B1, the second grinding chamber B2, and the third grinding chamber B3 in this order in a clockwise direction.

The grinding apparatus 1 has, in each of the first grinding chamber B1, the second grinding chamber B2 and the third grinding chamber B3, a measuring device 85 configured to measure the thickness of the substrate W. By way of example, although not shown in the drawing, the measuring device 85 includes a first height sensor and a second height sensor. The first height sensor is configured to measure the height of the substrate W. The second height sensor is configured to measure the height of the chuck 20. The thickness of the substrate W can be measured from a difference between the height of the substrate W and the height of the chuck 20. Although the measuring device 85 is of a contact type, it may be of a non-contact type.

The measuring device 85 is mounted to a top surface of a fixed shaft 11 and is protruded outwards in a diametrical direction of the fixed shaft 11. The fixed shaft 11 is disposed on the rotation center line R1 of the rotary table 10. The fixed shaft 11 is fixed and is not rotated together with the rotary table 10. On the fixed shaft 11, the four fixed partition walls 84 are provided in the cross shape.

The grinding apparatus 1 has, in each of the first grinding chamber B1, the second grinding chamber B2 and the third grinding chamber B3, three sprinklers 70A, 70B and 70C, for example. One sprinkler 70A supplies the cleaning liquid to the side panel 52 of the housing 50, the fixed partition wall 84, and the moving unit 31 of the grinding unit 30. Another sprinkler 70B supplies the cleaning liquid to the side panel 52 of the housing 50 and the moving unit 31 of the grinding unit 30. These two sprinklers 70A and 70B are mounted to the top moving portion 512 shown in FIG. 7, and supplies the cleaning liquid to the top moving portion 512 as well.

The other sprinkler 70C supplies the cleaning liquid to the measuring device 85, the fixed partition wall 84, and the moving unit 31 of the grinding unit 30. Grinding debris adhering to the measuring device 85 can be washed away by the cleaning liquid. Moreover, the measuring device 85 can also be cooled by the cleaning liquid. Although the cleaning liquid has a room temperature, it may have a lower temperature. The sprinkler 70C is mounted to the top fixed portion 511 shown in FIG. 7, and supplies the cleaning liquid to the top fixed portion 511 as well.

So far, the exemplary embodiment of the processing apparatus according to the present disclosure have been described. However, the present disclosure is not limited to the above-described exemplary embodiment and the like. Various changes, modifications, substitutions, additions, deletions and combinations may be made within the scope of the claims, which are all incorporated within a technical scope of the present disclosure.

This application claims priority to Japanese Patent Application No. 2020-023923 filed on Feb. 17, 2020 and Japanese Patent Application No. 2020-196352 filed on Nov. 26, 2020, which applications are hereby incorporated by reference in their entirety.

According to the exemplary embodiments, it is possible to suppress the adhesion of the processing debris to the moving unit to which the processing tool is mounted.

I claim:
1. A processing apparatus, comprising:
a chuck configured to hold a substrate;
a moving unit to which a processing tool configured to process the substrate is mounted, wherein the moving unit comprises a flange to which the processing tool is mounted and a spindle shaft on which the flange is provided;
a sprinkler configured to spray a cleaning liquid configured to clean the moving unit from an outside of the moving unit; and
a housing accommodating the chuck, the processing tool, and the sprinkler therein,
wherein the sprinkler comprises a fixed unit fixed to an inside of the housing, and a rotating unit rotatably supported at the fixed unit,
wherein the rotating unit comprises a nozzle configured to discharge the cleaning liquid toward the moving unit to clean the moving unit, and a rotation block configured to hold the nozzle,
wherein the rotating unit rotates while spraying the cleaning liquid from the nozzle toward the moving unit and the housing to clean the moving unit and the housing,
wherein the moving unit comprises a spindle cover that surrounds the spindle shaft, and
wherein the nozzle is configured to discharge the cleaning liquid toward the spindle cover.

2. The processing apparatus of claim 1,
wherein when viewed from a direction parallel to a rotation center line of the rotation block, a discharge line of the nozzle lies parallel to an orthogonal line to the rotation center line of the rotation block while being deviated therefrom.

3. The processing apparatus of claim 1,
wherein the nozzle includes multiple nozzles, and the multiple nozzles are mounted to the single rotation block.

4. The processing apparatus of claim 3,
wherein the multiple nozzles have different discharge angles and are mounted to the single rotation block.

5. The processing apparatus of claim 3,
wherein the multiple nozzles are arranged rotationally symmetrically about a rotation center line of the single rotation block.

6. The processing apparatus of claim 1,
wherein the rotating unit comprises a counter weight on an opposite side from the nozzle with respect to a rotation center line of the rotation block.

7. The processing apparatus of claim 1, further comprising:
a rotation stop detector configured to detect a stop of a rotation of the rotation block of the sprinkler.

8. The processing apparatus of claim 7,
wherein the rotation stop detector is located outside the housing, and comprises a light emitter and a light receiver,
the rotating unit of the sprinkler comprises a light reflecting member configured to reflect light of the light emitter to the light receiver, and
a through hole, which is a passage for the light, is formed at each of the fixed unit of the sprinkler and the housing.

9. The processing apparatus of claim 1,
wherein the fixed unit comprises a mounting plate mounted to the housing, a fixed shaft disposed on a rotation center line of the rotation block, a first gap forming portion forming a gap with respect to the rotation block at a first end of the fixed shaft, and a second gap forming portion forming a gap with respect to the rotation block at a second end of the fixed shaft.

10. The processing apparatus of claim 1,
wherein the housing comprises a top panel forming a top surface of the housing, and
the fixed unit comprises a mounting plate horizontally mounted to a bottom surface of the top panel, a fixed shaft disposed on a rotation center line of the rotation block, and a ring protruded from a periphery of a bottom surface of the mounting plate to surround the fixed shaft.

11. The processing apparatus of claim 1,
wherein the housing comprises a top panel forming a top surface of the housing, and a side panel forming a side surface of the housing, and
the sprinkler is disposed at a position where the sprinkler is allowed to supply the cleaning liquid to the top panel or the side panel.

12. The processing apparatus of claim 1, further comprising:
a measuring device configured to measure a thickness of the substrate held by the chuck,
wherein the sprinkler supplies the cleaning liquid to the moving unit and the measuring device.

13. A processing apparatus, comprising:
a chuck configured to hold a substrate;
a moving unit to which a processing tool configured to process the substrate is mounted;
a sprinkler configured to spray a cleaning liquid configured to clean the moving unit from an outside of the moving unit; and
a housing accommodating the chuck, the processing tool, and the sprinkler therein,
wherein the sprinkler comprises a fixed unit fixed to an inside of the housing, and a rotating unit rotatably supported at the fixed unit,
wherein the rotating unit comprises a nozzle configured to discharge the cleaning liquid, and a rotation block configured to hold the nozzle,
wherein the sprinkler includes a first flow path through which the cleaning liquid is supplied from the fixed unit to the nozzle via the rotation block, and a second flow path branched off from the first flow path to allow the cleaning liquid to leak from a gap between the fixed unit and the rotation block, and
wherein the second flow path includes a cylindrical portion centered on a rotation center line of the rotation block.

14. The processing apparatus of claim 13,
wherein the rotation center line of the rotation block is vertically disposed, and
the second flow path includes a first supply portion configured to supply the cleaning liquid to a top surface of the rotation block.

15. The processing apparatus of claim 14,
wherein the top surface of the rotation block includes a conical surface that is inclined vertically downwards as it goes outwards in a diametrical direction from the rotation center line of the rotation block.

16. The processing apparatus of claim 14,
wherein the second flow path includes a second supply portion configured to supply the cleaning liquid to a bottom surface of the rotation block.

17. The processing apparatus of claim 13,
wherein the sprinkler comprises an adjusting member configured to adjust a distribution ratio between a flow rate of the cleaning liquid discharged by the nozzle and a flow rate of the cleaning liquid leaking form the gap between the fixed unit and the rotation block.

18. The processing apparatus of claim 13,
wherein the rotation center line of the rotation block is vertically disposed,
the second flow path comprises a first supply portion configured to supply the cleaning liquid to a top surface of the rotation block, a first intermediate portion provided between the cylindrical portion and the first supply portion, a second supply portion configured to supply the cleaning liquid to a bottom surface of the rotation block, and a second intermediate portion provided between the cylindrical portion and the second supply portion,
the sprinkler comprises a first adjusting member and a second adjusting member configured to adjust a distribution ratio between a flow rate of the cleaning liquid discharged by the nozzle and a flow rate of the cleaning liquid leaking from the gap between the fixed unit and the rotation block, and
the first adjusting member is disposed at the first intermediate portion and the second adjusting member is disposed at the second intermediate portion.

19. A processing apparatus, comprising:
a chuck configured to hold a substrate;
a moving unit to which a processing tool configured to process the substrate is mounted;
a sprinkler configured to spray a cleaning liquid configured to clean the moving unit from an outside of the moving unit; and
a housing accommodating the chuck, the processing tool, and the sprinkler therein,
wherein the sprinkler comprises a fixed unit fixed to an inside of the housing, and a rotating unit rotatably supported at the fixed unit,
wherein the rotating unit comprises a nozzle configured to discharge the cleaning liquid, and a rotation block configured to hold the nozzle,
wherein the housing comprises a top panel forming a top surface of the housing, and a side panel forming a side surface of the housing,
wherein the sprinkler is disposed at a position where the sprinkler is allowed to supply the cleaning liquid to the top panel or the side panel,
wherein the side panel comprises a side fixed portion fixed vertically, and a side moving portion connected to the side fixed portion by a first hinge,
wherein the top panel comprises a top fixed portion fixed horizontally, and a top moving portion connected to the side moving portion by a second hinge, and
wherein the sprinkler is disposed at a position where the sprinkler is allowed to supply the cleaning liquid to the top moving portion or the side moving portion.

20. The processing apparatus of claim 19,
wherein when the top moving portion and the side moving portion are folded horizontally, a thickness of the sprinkler is smaller than a gap between the top moving portion and the side moving portion, so that the sprinkler is disposed in the gap.

\* \* \* \* \*